(12) United States Patent
Amundson et al.

(10) Patent No.: US 10,527,899 B2
(45) Date of Patent: Jan. 7, 2020

(54) BACKPLANES FOR ELECTRO-OPTIC DISPLAYS

(71) Applicant: E Ink Corporation, Billerica, MA (US)

(72) Inventors: Karl Raymond Amundson, Cambridge, MA (US); Yi Lu, Waltham, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 15/604,797

(22) Filed: May 25, 2017

(65) Prior Publication Data

US 2017/0343876 A1 Nov. 30, 2017

Related U.S. Application Data

(60) Provisional application No. 62/343,551, filed on May 31, 2016.

(51) Int. Cl.
*G02F 1/1362* (2006.01)
*G02F 1/167* (2019.01)

(52) U.S. Cl.
CPC ........ *G02F 1/136286* (2013.01); *G02F 1/167* (2013.01); *G02F 2001/136218* (2013.01)

(58) Field of Classification Search
CPC ........ G02F 1/01; G02F 1/03; G02F 1/133345; G02F 1/136209; G02F 1/136213; G02F 1/136227; G02F 1/136277; G02F 1/136286; G02F 1/1368; G02F 1/15; G02F 1/153; G02F 1/176; G02F 2001/13606; G02F 2001/136218; G02F 2201/123; G02B 26/00; G09G 3/19; G09G 3/20; G09G 3/2092; G09G 3/36; G09G 3/3688; G09G 3/38; G09G 2300/0426; G09G 2320/0209; G09G 2320/0223; G09G 2320/0233
USPC ....... 359/245, 250, 252, 265, 267, 270, 271, 359/274, 275, 296; 345/49, 58, 84, 88, 345/92, 98, 100, 105; 349/38, 42, 43, 349/110, 111; 257/59, 98, 212, 213, 257/E27.111, E29.278, E29.282
See application file for complete search history.

(56) References Cited

U.S. PATENT DOCUMENTS 4,845,482 A 5/1989 Howard et al.
4,873,516 A 10/1989 Castleberry
(Continued)

FOREIGN PATENT DOCUMENTS

EP 1099207 5/2001
EP 1145072 10/2001
(Continued)

OTHER PUBLICATIONS

Korean Intellectual Property Office; PCT/US2017/034378; International Search Report and Written Opinion; dated Aug. 24, 2017. Aug. 24, 2017.
(Continued)

*Primary Examiner* — Collin X Beatty
(74) *Attorney, Agent, or Firm* — Zhen Bao

(57) ABSTRACT

A backplane for an electro-optic display that includes a data line, a transistor, a pixel electrode connected to the data line via the transistor, the pixel electrode positioned adjacent to part of the data line so as to create a data line/pixel electrode capacitance. The backplane further including a shield electrode disposed adjacent to at least part of the data line so as to reduce the data line/pixel electrode capacitance.

9 Claims, 3 Drawing Sheets

(56) References Cited

U.S. PATENT DOCUMENTS

| | | |
|---|---|---|
| 5,841,411 A | 11/1998 | Francis |
| 5,930,026 A | 7/1999 | Jacobson |
| 6,118,426 A | 9/2000 | Albert |
| 6,124,851 A | 9/2000 | Jacobson |
| 6,130,773 A | 10/2000 | Jacobson |
| 6,177,921 B1 | 1/2001 | Comiskey |
| 6,232,950 B1 | 5/2001 | Albert |
| 6,241,921 B1 | 6/2001 | Jacobson |
| 6,252,564 B1 | 6/2001 | Albert |
| 6,312,304 B1 | 11/2001 | Duthaler |
| 6,312,971 B1 | 11/2001 | Amundson |
| 6,376,828 B1 | 4/2002 | Comiskey |
| 6,392,786 B1 | 5/2002 | Albert |
| 6,413,790 B1 | 7/2002 | Duthaler |
| 6,422,687 B1 | 7/2002 | Jacobson |
| 6,445,374 B2 | 9/2002 | Albert |
| 6,445,489 B1 | 9/2002 | Jacobson |
| 6,473,072 B1 | 10/2002 | Comiskey |
| 6,480,182 B2 | 11/2002 | Turner |
| 6,498,114 B1 | 12/2002 | Amundson |
| 6,504,524 B1 | 1/2003 | Gates |
| 6,506,438 B2 | 1/2003 | Duthaler |
| 6,512,354 B2 | 1/2003 | Jacobson |
| 6,518,949 B2 | 2/2003 | Drzaic |
| 6,521,489 B2 | 2/2003 | Duthaler et al. |
| 6,531,997 B1 | 3/2003 | Gates |
| 6,535,197 B1 | 3/2003 | Comiskey |
| 6,545,291 B1 | 4/2003 | Amundson |
| 6,639,578 B1 | 10/2003 | Comiskey |
| 6,657,772 B2 | 12/2003 | Loxley |
| 6,664,944 B1 | 12/2003 | Albert |
| D485,294 S | 1/2004 | Albert |
| 6,672,921 B1 | 1/2004 | Liang |
| 6,680,725 B1 | 1/2004 | Jacobson |
| 6,683,333 B2 | 1/2004 | Kazlas |
| 6,704,133 B2 | 3/2004 | Gates |
| 6,710,540 B1 | 3/2004 | Albert |
| 6,724,513 B2 * | 4/2004 | Murade ............ G02F 1/136213 257/E27.111 |
| 6,724,519 B1 | 4/2004 | Comiskey |
| 6,738,050 B2 | 5/2004 | Comiskey |
| 6,750,473 B2 | 6/2004 | Amundson |
| 6,753,999 B2 | 6/2004 | Zehner |
| 6,788,449 B2 | 9/2004 | Liang |
| 6,816,147 B2 | 11/2004 | Albert |
| 6,819,471 B2 | 11/2004 | Amundson |
| 6,825,068 B2 | 11/2004 | Denis |
| 6,825,829 B1 | 11/2004 | Albert |
| 6,825,970 B2 | 11/2004 | Goenaga |
| 6,831,769 B2 | 12/2004 | Holman |
| 6,838,697 B2 * | 1/2005 | Murade ............ G02F 1/136209 257/59 |
| 6,842,167 B2 | 1/2005 | Albert |
| 6,842,279 B2 | 1/2005 | Amundson |
| 6,842,657 B1 | 1/2005 | Drzaic |
| 6,865,010 B2 | 3/2005 | Duthaler et al. |
| 6,866,760 B2 | 3/2005 | Paolini, Jr. |
| 6,900,851 B2 | 5/2005 | Morrison |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,995,550 B2 | 2/2006 | Jacobson |
| 7,002,728 B2 | 2/2006 | Pullen et al. |
| 7,012,600 B2 | 3/2006 | Zehner |
| 7,012,735 B2 | 3/2006 | Honeyman et al. |
| 7,019,807 B2 * | 3/2006 | Yamasaki ......... G02F 1/136213 349/110 |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates |
| 7,075,502 B1 | 7/2006 | Drzaic |
| 7,075,703 B2 | 7/2006 | O'Neil et al. |
| 7,106,296 B1 | 9/2006 | Jacobson |
| 7,110,163 B2 | 9/2006 | Webber et al. |
| 7,113,233 B2 | 9/2006 | Lyu |
| 7,116,318 B2 | 10/2006 | Amundson et al. |
| 7,116,466 B2 | 10/2006 | Whitesides et al. |
| 7,119,759 B2 | 10/2006 | Zehner et al. |
| 7,119,772 B2 | 10/2006 | Amundson |
| 7,148,128 B2 | 12/2006 | Jacobson |
| 7,164,408 B2 * | 1/2007 | Murade ............ G02F 1/136227 257/E27.111 |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,176,989 B2 * | 2/2007 | Takahara ......... G02F 1/136213 349/110 |
| 7,190,008 B2 | 3/2007 | Amundson et al. |
| 7,193,625 B2 | 3/2007 | Danner et al. |
| 7,193,663 B2 * | 3/2007 | Shimizu ............ G02F 1/1362 349/38 |
| 7,202,847 B2 | 4/2007 | Gates |
| 7,206,043 B2 * | 4/2007 | Iki ................. G02F 1/136209 349/110 |
| 7,206,119 B2 | 4/2007 | Honeyman et al. |
| 7,223,672 B2 | 5/2007 | Kazlas et al. |
| 7,230,751 B2 | 6/2007 | Whitesides et al. |
| 7,242,440 B2 * | 7/2007 | Kurashina ........ G02F 1/136227 349/111 |
| 7,256,766 B2 | 8/2007 | Albert et al. |
| 7,259,744 B2 | 8/2007 | Arango |
| 7,280,094 B2 | 10/2007 | Albert |
| 7,304,787 B2 | 12/2007 | Whitesides et al. |
| 7,312,784 B2 | 12/2007 | Baucom et al. |
| 7,312,794 B2 | 12/2007 | Zehner |
| 7,317,497 B2 * | 1/2008 | Shimizu ............ G02F 1/1362 257/59 |
| 7,327,511 B2 | 2/2008 | Whitesides et al. |
| 7,349,148 B2 | 3/2008 | Doshi et al. |
| 7,352,353 B2 | 4/2008 | Albert |
| 7,365,394 B2 | 4/2008 | Denis et al. |
| 7,365,733 B2 | 4/2008 | Duthaler |
| 7,382,363 B2 | 6/2008 | Albert et al. |
| 7,388,572 B2 | 6/2008 | Duthaler et al. |
| 7,411,719 B2 | 8/2008 | Paolini, Jr. et al. |
| 7,420,549 B2 | 9/2008 | Jacobson |
| 7,442,587 B2 | 10/2008 | Amundson et al. |
| 7,453,445 B2 | 11/2008 | Amundson |
| 7,492,339 B2 | 2/2009 | Amundson |
| 7,492,497 B2 | 2/2009 | Paolini, Jr. |
| 7,502,007 B2 * | 3/2009 | Ishii ............... G09G 3/3688 345/100 |
| 7,528,822 B2 | 5/2009 | Amundson |
| 7,535,624 B2 | 5/2009 | Amundson et al. |
| 7,545,358 B2 | 6/2009 | Gates et al. |
| 7,551,346 B2 | 6/2009 | Fazel |
| 7,554,712 B2 | 6/2009 | Patry et al. |
| 7,583,251 B2 | 9/2009 | Arango |
| 7,583,427 B2 | 9/2009 | Danner |
| 7,598,173 B2 | 10/2009 | Ritenour |
| 7,602,374 B2 | 10/2009 | Zehner et al. |
| 7,605,799 B2 | 10/2009 | Amundson et al. |
| 7,612,760 B2 | 11/2009 | Kawai |
| 7,636,191 B2 | 12/2009 | Duthaler |
| 7,649,674 B2 | 1/2010 | Danner |
| 7,667,886 B2 | 2/2010 | Danner |
| 7,672,040 B2 | 3/2010 | Sohn |
| 7,679,599 B2 | 3/2010 | Kawai |
| 7,679,814 B2 | 3/2010 | Paolini, Jr. et al. |
| 7,688,297 B2 | 3/2010 | Zehner et al. |
| 7,688,497 B2 | 3/2010 | Danner |
| 7,705,824 B2 | 4/2010 | Baucom et al. |
| 7,777,708 B2 | 4/2010 | Drader et al. |
| 7,729,039 B2 | 6/2010 | LeCain et al. |
| 7,733,311 B2 | 6/2010 | Amundson |
| 7,733,335 B2 | 6/2010 | Zehner et al. |
| 7,785,988 B2 | 8/2010 | Amundson |
| 7,787,169 B2 | 8/2010 | Abramson et al. |
| 7,839,564 B2 | 11/2010 | Whitesides et al. |
| 7,843,626 B2 | 11/2010 | Amundson et al. |

(56) References Cited

U.S. PATENT DOCUMENTS

| | | | |
|---|---|---|---|
| 7,859,637 B2 | 12/2010 | Amundson et al. |
| 7,893,435 B2 | 2/2011 | Kazlas et al. |
| 7,898,717 B2 | 3/2011 | Patry |
| 7,928,450 B2 | 4/2011 | Lin et al. |
| 7,952,557 B2 | 5/2011 | Amundson |
| 7,956,841 B2 | 6/2011 | Albert |
| 7,957,053 B2 | 6/2011 | Honeyman |
| 7,986,450 B2 | 7/2011 | Cao |
| 7,999,787 B2 | 8/2011 | Amundson |
| 8,009,344 B2 | 8/2011 | Danner |
| 8,009,348 B2 | 8/2011 | Zehner |
| 8,027,081 B2 | 9/2011 | Danner |
| 8,049,947 B2 | 11/2011 | Danner |
| 8,064,962 B2 | 11/2011 | Wilcox et al. |
| 8,077,141 B2 | 12/2011 | Duthaler |
| 8,089,453 B2 | 1/2012 | Comiskey |
| 8,125,501 B2 | 2/2012 | Amundson |
| 8,139,050 B2 | 3/2012 | Jacobson et al. |
| 8,174,490 B2 | 5/2012 | Whitesides |
| 8,207,925 B2 * | 6/2012 | Masui | G09G 3/3688 345/100 |
| 8,208,193 B2 | 6/2012 | Patry |
| 8,253,872 B2 | 8/2012 | Ina et al. |
| 8,289,250 B2 | 10/2012 | Zehner |
| 8,300,006 B2 | 10/2012 | Zhou |
| 8,305,341 B2 | 11/2012 | Arango |
| 8,314,784 B2 | 11/2012 | Ohkami |
| 8,319,759 B2 | 11/2012 | Jacobson |
| 8,373,211 B2 | 2/2013 | Amundson |
| 8,373,649 B2 | 2/2013 | Low |
| 8,384,658 B2 | 2/2013 | Albert |
| 8,389,381 B2 | 3/2013 | Amundson |
| 8,421,078 B2 | 4/2013 | Chang et al. |
| 8,498,042 B2 | 7/2013 | Danner |
| 8,525,960 B2 * | 9/2013 | Murade | G02F 1/1368 349/110 |
| 8,553,012 B2 | 10/2013 | Baucom |
| 8,558,783 B2 | 10/2013 | Wilcox |
| 8,558,785 B2 | 10/2013 | Zehner |
| 8,593,396 B2 | 11/2013 | Amundson |
| 8,610,988 B2 | 12/2013 | Zehner et al. |
| 8,728,266 B2 | 5/2014 | Danner |
| 8,754,859 B2 | 6/2014 | Gates |
| 8,830,560 B2 | 9/2014 | Danner |
| 8,891,155 B2 | 11/2014 | Danner |
| 8,928,562 B2 | 1/2015 | Gates et al. |
| 8,969,886 B2 | 3/2015 | Amundson |
| 8,994,705 B2 | 3/2015 | Jacobson |
| 9,030,395 B2 * | 5/2015 | Cho | G09G 3/3648 345/92 |
| 9,152,003 B2 | 10/2015 | Danner |
| 9,152,004 B2 | 10/2015 | Paolini, Jr. |
| 9,230,492 B2 | 1/2016 | Harrington |
| 9,269,311 B2 | 2/2016 | Amundson |
| 9,310,661 B2 | 4/2016 | Wu |
| 9,412,314 B2 | 8/2016 | Amundson |
| 9,419,024 B2 | 8/2016 | Amundson |
| 9,482,913 B2 * | 11/2016 | Nakagawa | G09G 3/3688 |
| 9,513,743 B2 | 12/2016 | Sjodin et al. |
| 9,542,895 B2 | 1/2017 | Gates |
| 9,548,323 B2 * | 1/2017 | Cho | G09G 3/3648 |
| 2002/0060321 A1 | 5/2002 | Kazlas |
| 2002/0090980 A1 | 7/2002 | Wilcox et al. |
| 2003/0102858 A1 | 6/2003 | Jacobson |
| 2004/0105036 A1 | 6/2004 | Danner et al. |
| 2004/0119681 A1 | 6/2004 | Albert et al. |
| 2005/0122306 A1 | 6/2005 | Wilcox et al. |
| 2005/0122563 A1 | 6/2005 | Honeyman et al. |
| 2005/0253777 A1 | 11/2005 | Zehner |
| 2007/0052757 A1 | 3/2007 | Jacobson |
| 2007/0091418 A1 | 4/2007 | Danner et al. |
| 2007/0103427 A1 | 5/2007 | Zhou et al. |
| 2007/0170504 A1 | 7/2007 | Chang |
| 2007/0285385 A1 | 12/2007 | Albert |
| 2008/0024429 A1 | 1/2008 | Zehner |
| 2008/0024482 A1 | 1/2008 | Gates |
| 2008/0136774 A1 | 6/2008 | Harris |
| 2008/0291129 A1 | 11/2008 | Harris |
| 2009/0122389 A1 | 5/2009 | Whitesides |
| 2009/0174651 A1 | 7/2009 | Jacobson |
| 2009/0195568 A1 | 8/2009 | Sjodin |
| 2009/0315044 A1 | 12/2009 | Amundson |
| 2009/0322721 A1 | 12/2009 | Zehner |
| 2010/0220121 A1 | 9/2010 | Zehner |
| 2010/0265561 A1 | 10/2010 | Gates et al. |
| 2011/0140744 A1 | 6/2011 | Kazlas |
| 2011/0187683 A1 | 8/2011 | Wilcox |
| 2011/0187689 A1 | 8/2011 | Bishop |
| 2011/0193840 A1 | 8/2011 | Amundson |
| 2011/0193841 A1 | 8/2011 | Amundson |
| 2011/0199671 A1 | 8/2011 | Amundson |
| 2011/0292319 A1 | 12/2011 | Cole |
| 2012/0293858 A1 | 11/2012 | Telfer |
| 2013/0063333 A1 | 3/2013 | Arango |
| 2013/0194250 A1 | 8/2013 | Amundson |
| 2013/0278900 A1 | 10/2013 | Hertel et al. |
| 2014/0009817 A1 | 1/2014 | Wilcox et al. |
| 2014/0078024 A1 | 3/2014 | Paolini, Jr. |
| 2014/0139501 A1 | 5/2014 | Amundson |
| 2014/0240373 A1 | 8/2014 | Harrington |
| 2014/0253425 A1 | 9/2014 | Zalesky |
| 2014/0292830 A1 | 10/2014 | Harrington et al. |
| 2014/0300837 A1 | 10/2014 | Gates |
| 2014/0333685 A1 | 11/2014 | Sim |
| 2015/0070744 A1 | 3/2015 | Danner et al. |
| 2015/0205178 A1 | 7/2015 | Paolini, Jr. |
| 2015/0213765 A1 | 7/2015 | Gates |
| 2015/0221257 A1 | 8/2015 | Wilcox et al. |
| 2015/0226986 A1 | 8/2015 | Paolini, Jr. |
| 2015/0227018 A1 | 8/2015 | Paolini, Jr. |
| 2015/0228666 A1 | 8/2015 | Paolini, Jr. |
| 2015/0261057 A1 | 9/2015 | Harris |
| 2015/0262255 A1 | 9/2015 | Khajehnouri |
| 2017/0031190 A1 * | 2/2017 | Nakagawa | G09G 3/3688 |

FOREIGN PATENT DOCUMENTS

| | | |
|---|---|---|
| WO | 2000036560 | 6/2000 |
| WO | 2000038000 | 6/2000 |

OTHER PUBLICATIONS

European Patent Office, EP Appl. No. 17807261.7, Extended European Search Report, dated Mar. 15, 2019.

* cited by examiner

BACKPLANES FOR ELECTRO-OPTIC DISPLAYS

RELATED APPLICATIONS

This application claims priority to U.S. Provisional Application No. 62/343,551, filed May 31, 2016, which is incorporated herein by reference in its entirety.

SUBJECT OF THE INVENTION

This invention relates to electro-optic display apparatuses, more particularly, to display backplanes that include thin-film transistor arrays.

BACKGROUND OF INVENTION

The present invention relates to backplanes for electro-optic displays. More specifically, it is related to display pixel designs where pixel electrode crosstalk may be effectively reduced.

The term "electro-optic" as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example the aforementioned white and dark blue states. The term "monochrome" may be used hereinafter to denote a drive scheme which only drives pixels to their two extreme optical states with no intervening gray states.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published US Patent Application No. 2002/0180687 (see also the corresponding International Application Publication No. WO 02/079869) that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "impulse" is used herein in its conventional meaning of the integral of voltage with respect to time. However, some bistable electro-optic media act as charge transducers, and with such media an alternative definition of impulse, namely the integral of current over time (which is equal to the total charge applied) may be used. The appropriate definition of impulse should be used, depending on whether the medium acts as a voltage-time impulse transducer or a charge impulse transducer.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;
(b) Capsules, binders and encapsulation processes; see for example U.S. Pat. Nos. 6,922,276 and 7,411,719;
(c) Films and sub-assemblies containing electro-optic materials; see for example U.S. Pat. Nos. 6,982,178 and 7,839,564;
(d) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,327,511; 7,349,148; 7,352,353; 7,365,394; 7,365,733; 7,382,363; 7,388,572; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,843,626; 7,859,637; 7,893,435; 7,898,717; 7,957,053; 7,986,450; 8,009,344; 8,027,081; 8,049,947; 8,077,141; 8,089,453; 8,208,193; 8,373,211; 8,389,381; 8,498,042; 8,610,988; 8,728,266; 8,754,859; 8,830,560; 8,891,155; 8,969,886; 9,152,003; and 9,152,004; and U.S. Patent Applications Publication Nos. 2002/0060321; 2004/0105036; 2005/0122306; 2005/0122563; 2007/0052757; 2007/0097489; 2007/0109219; 2009/0122389; 2009/0315044; 2011/0026101; 2011/0140744; 2011/0187683; 2011/0187689; 2011/0292319; 2013/0278900; 2014/0078024; 2014/0139501; 2014/0300837; 2015/0171112; 2015/0205178; 2015/0226986; 2015/0227018; 2015/0228666; and 2015/0261057; and International Application Publication No. WO 00/38000; European Patents Nos. 1,099,207 B1 and 1,145,072 B1;

(e) Color formation and color adjustment; see for example U.S. Pat. Nos. 7,075,502 and 7,839,564;

(f) Methods for driving displays; see for example U.S. Pat. Nos. 5,930,026; 6,445,489; 6,504,524; 6,512,354; 6,531,997; 6,753,999; 6,825,970; 6,900,851; 6,995,550; 7,012,600; 7,023,420; 7,034,783; 7,116,466; 7,119,772; 7,193,625; 7,202,847; 7,259,744; 7,304,787; 7,312,794; 7,327,511; 7,453,445; 7,492,339; 7,528,822; 7,545,358; 7,583,251; 7,602,374; 7,612,760; 7,679,599; 7,688,297; 7,729,039; 7,733,311; 7,733,335; 7,787,169; 7,952,557; 7,956,841; 7,999,787; 8,077,141; 8,125,501; 8,139,050; 8,174,490; 8,289,250; 8,300,006; 8,305,341; 8,314,784; 8,373,649; 8,384,658; 8,558,783; 8,558,785; 8,593,396; and 8,928,562; and U.S. Patent Application Publication Nos. 2003/0102858; 2005/0253777; 2007/0091418; 2007/0103427; 2008/0024429; 2008/0024482; 2008/0136774; 2008/0291129; 2009/0174651; 2009/0179923; 2009/0195568; 2009/0322721; 2010/0220121; 2010/0265561; 2011/0193840; 2011/0193841; 2011/0199671; 2011/0285754; 2013/0063333; 2013/0194250; 2013/0321278; 2014/0009817; 2014/0085350; 2014/0240373; 2014/0253425; 2014/0292830; 2014/0333685; 2015/0070744; 2015/0109283; 2015/0213765; 2015/0221257; and 2015/0262255;

(g) Applications of displays; see for example U.S. Pat. Nos. 6,118,426; 6,473,072; 6,704,133; 6,710,540; 6,738,050; 6,825,829; 7,030,854; 7,119,759; 7,312,784; and 8,009,348; 7,705,824; 8,064,962; and 8,553,012; and U.S. Patent Application Publication Nos. 2002/0090980; 2004/0119681; and 2007/0285385; and International Application Publication No. WO 00/36560; and (h) Non-electrophoretic displays, as described in U.S. Pat. Nos. 6,241,921; 6,950,220; 7,420,549 8,319,759; and 8,994,705 and U.S. Patent Application Publication No. 2012/0293858.

Many of the aforementioned patents and applications recognize that the walls surrounding the discrete microcapsules in an encapsulated electrophoretic medium could be replaced by a continuous phase, thus producing a so-called polymer-dispersed electrophoretic display in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; inkjet printing processes; and other similar techniques.) Thus, the resulting display can be flexible. Further, because the display medium can be printed (using a variety of methods), the display itself can be made inexpensively.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Application Publication No. WO 02/01281, and published U.S. Application No. 2002/0075556, both assigned to Sipix Imaging, Inc.

The aforementioned types of electro-optic displays are bistable and are typically used in a reflective mode, although as described in certain of the aforementioned patents and applications, such displays may be operated in a "shutter mode" in which the electro-optic medium is used to modulate the transmission of light, so that the display operates in a transmissive mode. Liquid crystals, including polymer-dispersed liquid crystals, are, of course, also electro-optic media, but are typically not bistable and operate in a transmissive mode. Certain embodiments of the invention described below are confined to use with reflective displays, while others may be used with both reflective and transmissive displays, including conventional liquid crystal displays.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high-resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner.

Processes for manufacturing active matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Liquid crystal displays commonly employ amorphous silicon ("a-Si"), thin-film transistors ("TFT's") as switching devices for display pixels. Such TFT's typically have a bottom-gate configuration. Within one pixel, a thin film capacitor typically holds a charge transferred by the switching TFT. Electrophoretic displays can use similar TFT's with capacitors, although the function of the capacitors differs somewhat from those in liquid crystal displays; see the aforementioned copending application Ser. No. 09/565, 413, now U.S. Pat. No. 7,030,412 and Publications 2002/0106847 and 2002/0060321. Thin film transistors can be fabricated to provide high performance. Fabrication processes, however, can result in significant cost.

In TFT addressing arrays, pixel electrodes are charged via the TFT's during a line address time. During the line address time, a TFT is switched to a conducting state by changing an applied gate voltage. For example, for an n-type TFT, a gate voltage is switched to a "high" state to switch the TFT into a conducting state.

Undesirably, the pixel electrode typically exhibits a voltage shift when the select line voltage is changed to bring the TFT channel into depletion. The pixel electrode voltage shift occurs because of the capacitance between the pixel electrode and the TFT gate electrode. The voltage shift can be modeled as:

$$\Delta V_p = \frac{C_{gp}}{C_{gp} + C_p + C_s} \Delta$$

where $C_{gp}$ is the gate-pixel capacitance, $C_p$ the pixel capacitance, $C_s$ the storage capacitance and $\Delta$ is the fraction of the gate voltage shift when the TFT is effectively in depletion. This voltage shift is often referred to as "gate feedthrough".

Gate feedthrough can be compensated by shifting the top plane voltage (the voltage applied to the common front electrode) by an amount $\Delta V_p$. Complications arise, however, because $\Delta V_p$ varies from pixel to pixel due to variations of $C_{gp}$ from pixel to pixel. Thus, voltage biases can persist even when the top plane is shifted to compensate for the average pixel voltage shift. The voltage biases can cause errors in the optical states of pixels, as well as degrade the electro-optic medium.

Variations in $C_{gp}$ are caused, for example, by misalignment between the two conductive layers used to form the gate and the source-drain levels of the TFT; variations in the gate dielectric thickness; and variations in the line etch, i.e., line width errors.

Furthermore, additional voltage shifts may be caused by crosstalk occurring between a data line supplying driving waveforms to the display pixel and the pixel electrode. Similar to the voltage shift described above, crosstalk between the data line and the pixel electrode can be caused by capacitive coupling between the two even when the display pixel is not being addressed (e.g., associated pixel TFT in depletion). Such crosstalk can result in voltage shifts that are undesirable because it can lead to optical artifacts such as image streaking.

The voltage shift between the data line and the pixel electrode may be reduced by altering the geometrical dimensions of the pixel electrode and/or the data line. For example, the size of the pixel electrode may be reduced to enlarge the gap space between the electrode and the data line. In some other embodiments, the electrical properties of the material between the pixel electrode and the data line may be altered to reduce crosstalk. For example, one may increase the thickness of the insulating thin film between the pixel electrode and its neighboring data lines to reduce capacitive coupling. However, these methods can be expensive to implement and in some instances impossible due to design constraints such as device dimensional limitations. As such, there exists a need to reduce crosstalk in display pixels that are both easy and inexpensive to implement.

The present invention provides means to reduce crosstalk and voltage shifts in display pixels that can be conveniently applied to presently available display backplanes.

SUMMARY OF INVENTION

This invention provides a backplane for an electro-optic display, the backplane may include a data line, a transistor, and a pixel electrode connected to the data line via the transistor, where the pixel electrode may be positioned adjacent to part of the data line so as to create a data line/pixel electrode capacitance. The backplane may further include a shield electrode disposed adjacent to at least part of the data line so as to reduce the data line/pixel electrode capacitance.

DETAILED DESCRIPTION

As indicated above, the present invention provides a display backplane for electro-optic displays where crosstalk between pixel electrodes and data lines are reduced. Such backplanes may include display pixels where crosstalk due to capacitive couplings can be shielded by additional shield electrodes. In some embodiments, the shield electrodes may be positioned on the same device layer as the data lines and/or in the gap spaces between the pixel electrodes and the data lines.

It should be appreciated that the backplanes described herein may be extended to an electro-optic display comprising a layer of electro-optic medium disposed on the backplane and covering the pixel electrode. Such an electro-optic display may use any of the types of electro-optic medium previously discussed, for example, the electro-optic medium may be a liquid crystal, a rotating bichromal member or electrochromic medium, or an electrophoretic medium, preferably an encapsulated electrophoretic medium. In some embodiments, when an electrophoretic medium is utilized, a plurality of charged particles can move through a suspending fluid under the influence of an electric field. Such electrophoretic displays can have attributes of good brightness and contrast, wide viewing angles, state bistability, and low power consumption when compared with liquid crystal displays.

Figure 1A:
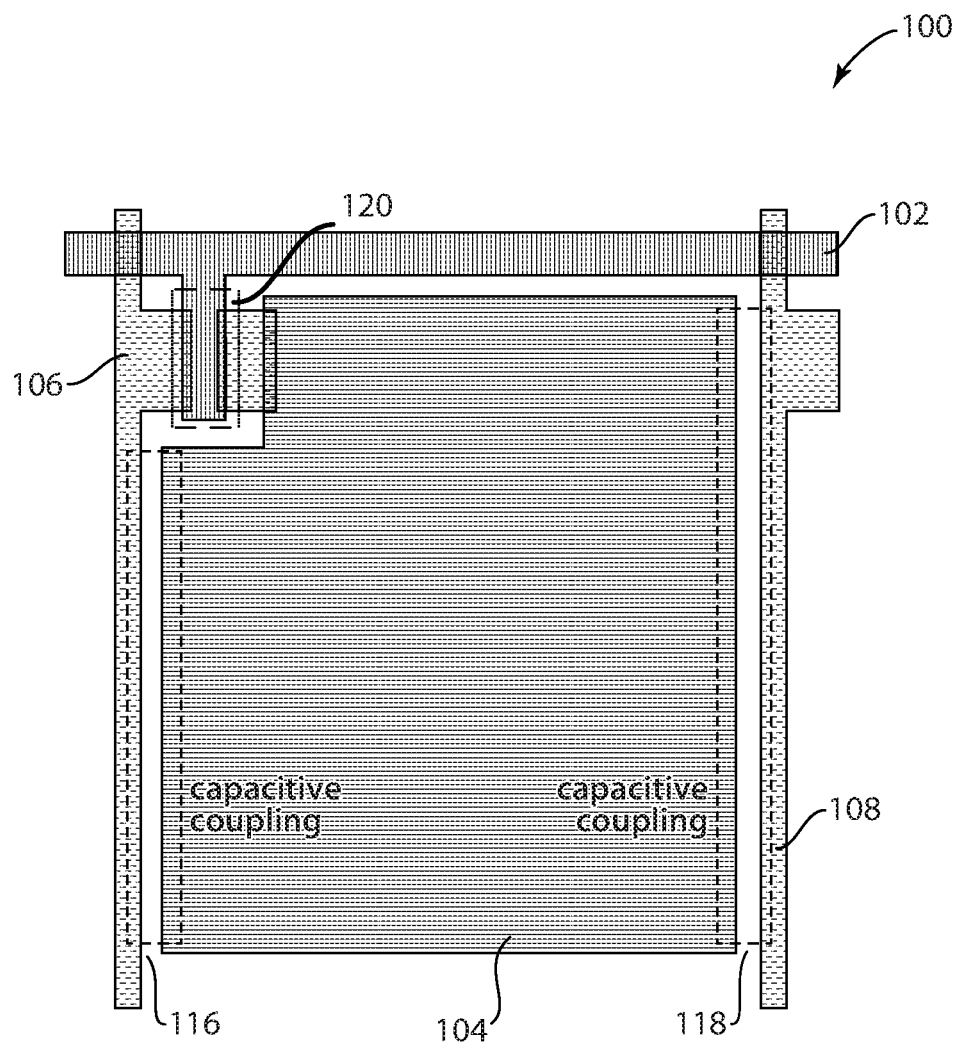
FIG. 1A illustrates a top view of a display pixel in accordance with the subject matter disclosed herein.
Figure 1B:
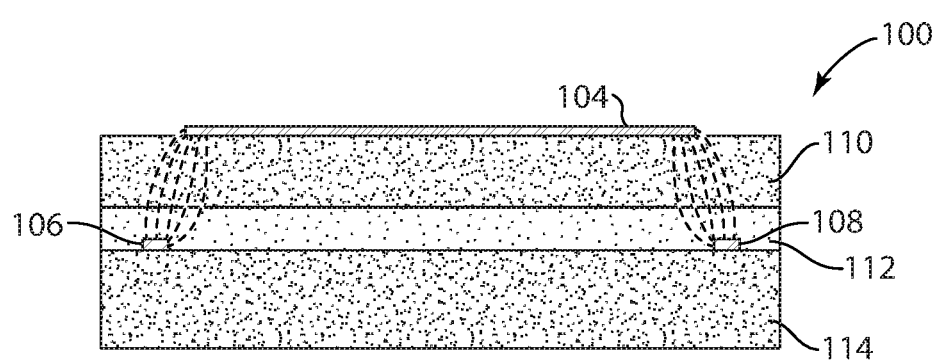
FIG. 1B illustrates a cross-sectional view of the display pixel presented in FIG. 1A in accordance with the subject matter disclosed herein.

FIG. 1A illustrates a top view of a display pixel 100 using a TFT 120 as means for switching. The pixel 100 can include a gate line 102 functioning as a source line to the display pixel and configured to supply switching signals to a pixel electrode 104. A data line 106 may be electrically coupled to the pixel electrode 104 and the gate line 102 for supplying driving signals (e.g., waveforms) to the pixel electrode 104. In addition, another data line 108 may be positioned adjacent to the pixel electrode 104 on an opposite side away from the data line 104 for providing driving waveforms to a neighboring pixel electrode (not shown). From the top view illustrated in FIG. 1A, the data lines 106 and 108 are separated from the pixel electrode 104 by gap spaces 116 and 118 respectfully. Referring now to FIG. 1B, FIG. 1B illustrates a cross-sectional view of the display pixel 100 presented in FIG. 1A. As shown, the display pixel 100 may include three or more device layers 110, 112, 114. In some embodiments, the pixel electrode 104 may be positioned on a first device layer 110 and the data lines 106, 108 may be positioned on a third device layer 114, where the first 110 and third 114 device layers are insulated by a second device layer 112. The second device layer 112 may include dielectric materials such as silicon-nitride or other comparable dielectric material such that the first and third device layers are electrically insulated from each other. In operation, for example, when the display pixel 100 is being addressed (i.e., pixel TFT 120 in conduction), driving voltage signals (i.e., waveforms) are transferred from the data line 106 to the pixel electrode 104. However, problems can arise when the display pixel 100 is not being addressed (i.e., associated pixel TFT in depletion) and yet capacitive coupling between the data lines 106, 108 and the pixel electrode 104 is still causing voltage values of the pixel electrode 104 to shift. As shown in FIG. 1B, electric fields can be coupled between the data lines 106, 108 and the pixel electrode 104 through the second dielectric device layer 112.

As described above, the coupling of the electric fields between the data lines 106, 108 and the pixel electrode 104 creates undesirable crosstalk and such crosstalk can lead to unwanted optical transitions. One way to reduce such crosstalk and discussed in more detail below is to position shield electrodes between the data lines 106, 108 and the pixel electrode 104.

Figure 2A:
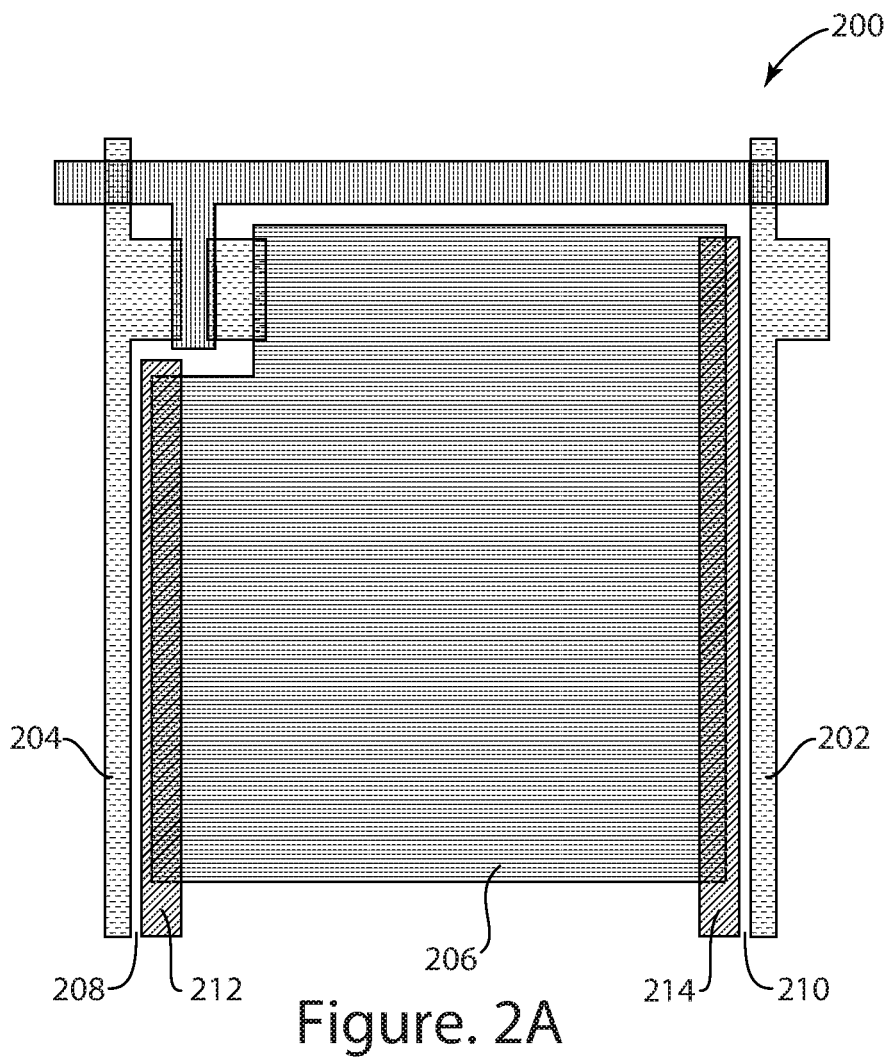
FIG. 2A and FIG. 2B illustrate a display pixel with shield electrodes in accordance with the subject matter presented herein.
Figure 2B:
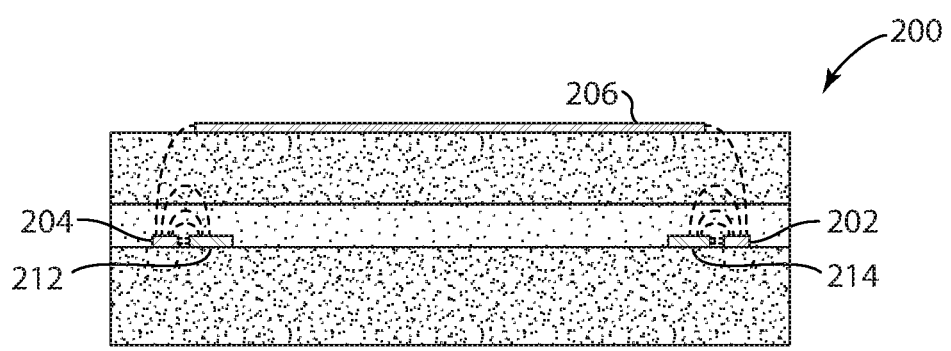

FIGS. 2A and 2B illustrate another embodiment of a TFT pixel 200 where capacitive coupling between data lines 202, 204 and the pixel electrode 206 may be reduced by placing one or more shield electrodes 212, 214 into the gap spaces 208 and 210.

In this configuration, the shield electrodes 212, 214 may be placed next to the data lines 202, 204 and tied to a voltage source (e.g., ground), where the shield electrodes 212, 214 can hold substantially constant voltage values during active-matrix scans. As illustrated in FIGS. 2A and 2B, the shield electrodes 212, 214 may be positioned in proximity to the data lines 202, 204, and on the same device level as the data lines 202, 204. Furthermore, the shield electrodes 212, 214 can substantially be of the same geometric shape, or even mirror images to the data lines 202, 204, even though other geometric shapes may be conveniently adopted so long as a reduction in the crosstalk can be achieved. In this fashion, the data lines 202, 204 are positioned closer to the neighboring shield electrodes 212, 214 than to the pixel electrode 206, and a larger portion of the electrical field from the data lines 202, 204 will instead be coupled to the shield electrodes 212, 214. In some embodiments, this diversion of the electric field may be due to the fact that there is less dielectric material between the data lines 202, 204 and the shield electrodes 212, 214, and as such the electric fields have easier travel paths from the data lines 202, 204 to the shield electrodes 212, 214 than to the pixel electrode 206. Put it another way, the mutual capacitance between the pixel electrode 206 and nearby data lines 202, 204 is reduced by the presence of the shield electrodes 212, 214. The result is that, when a data line voltage shifts, a nearby pixel electrode will experience less voltage change through capacitive coupling because of the presence of the shield electrodes.

It should be appreciated that the placement and geometrical dimensions of the shield electrodes may be varied so long as the leakage capacitance between the pixel electrode and the data lines are reduced. For example, different from what's shown in FIG. 2B, where portions of the shield electrodes 212, 214 overlap with or extend underneath the pixel electrode 206, in some embodiments, the shield electrodes may be positioned entirely in the gap spaces between the pixel electrode and neighboring controlling data lines, such that there is no vertical overlapping between the pixel electrode and the data lines.

Figure 3:
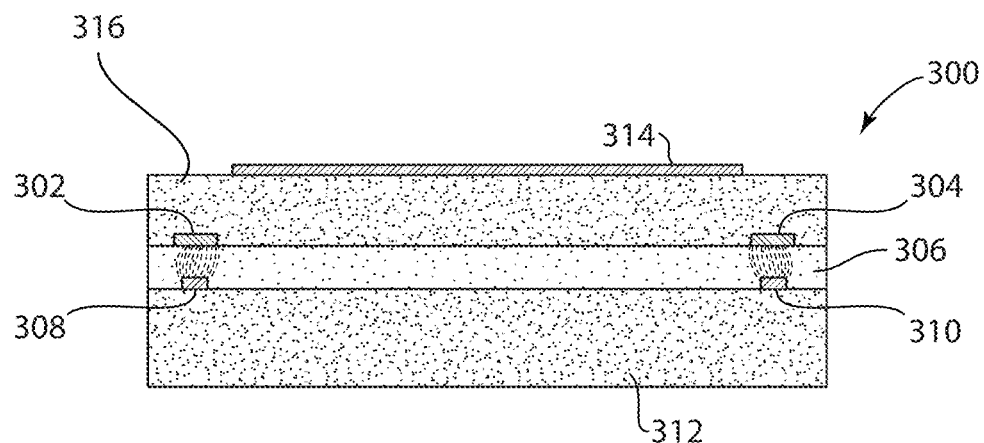
FIG. 3 illustrates a cross-sectional view of another embodiment of a display pixel in accordance with the subject matter presented herein.

In some embodiments, the shield electrodes may be positioned in a different device layer than the data lines. Furthermore, the dimensions of the shield electrodes may be sufficiently large (e.g., wider than the data lines) to completely shield the data lines from the pixel electrode in the vertical direction, as illustrated in FIG. 3. FIG. 3 illustrates a cross-sectional view of a display pixel 300 where the shield electrodes 302, 304 are positioned on the second device level 306, completely shielding data lines 308, 310 below on the third device level 312 from the pixel electrode 314 positioned on the first device layer 316.

Figure 4:
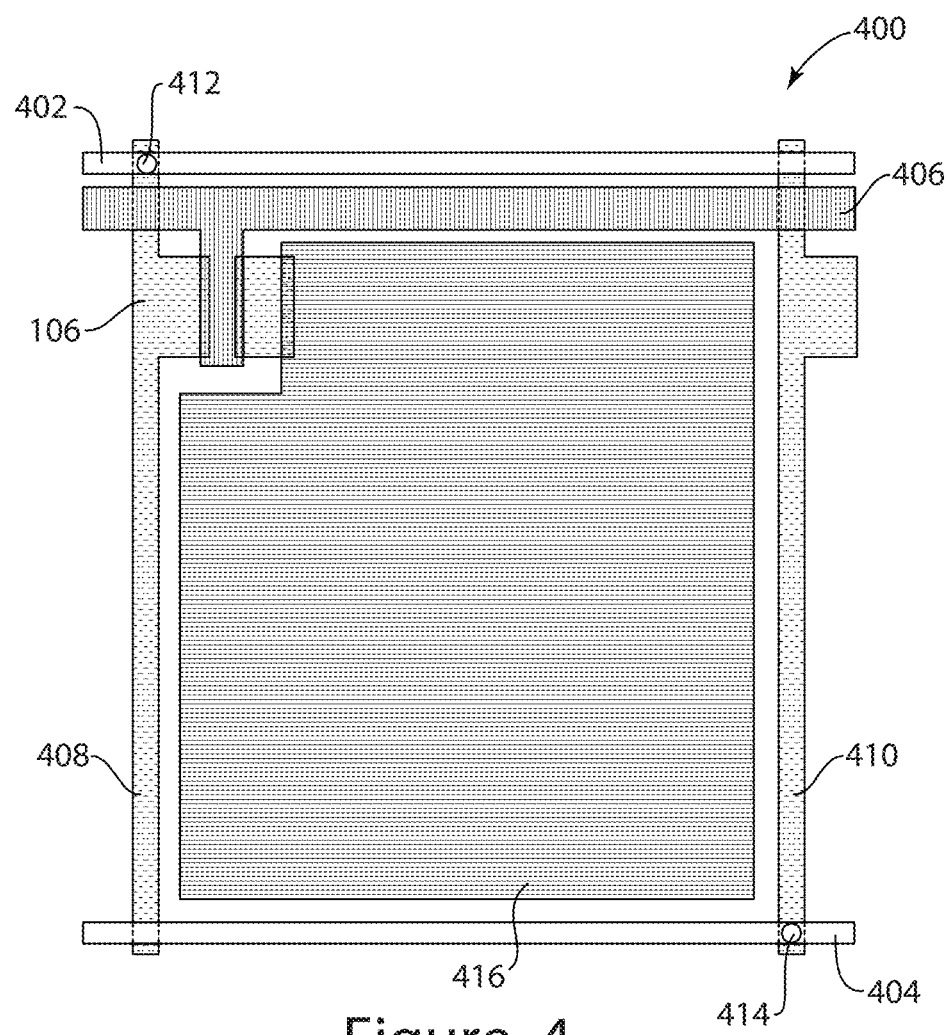
FIG. 4 illustrates a top view of yet another embodiment of a display pixel in accordance with the subject matter presented herein.

In yet another embodiment shown in FIG. 4, a display pixel 400 may include additional data lines 402, 404 positioned in parallel to the gate line 406. The additional data lines 402, 404 may be positioned on a different device layer than the data lines 408, 410 and may be connected to the data lines 408, 410 through one or more vias 412, 414. In this configuration, shield electrodes (not shown) can be optionally placed between the additional data lines 402, 404 and the pixel electrode 416 to reduce crosstalk.

It should be appreciated that even though the shield electrodes described in the previous embodiments may be coupled to a fixed voltage (e.g., ground) during the active-matrix scan to maintain a substantially constant voltage value, in some other embodiments, the shield electrodes may be configured to possess strong capacitive coupling to other substantially fixed-voltage electrodes. In this fashion, the shield electrodes will still be able to maintain a sufficiently stable voltage and provide reduction to the crosstalk while not be actively driven by external electronics.

From the foregoing, it will be seen that the present invention can provide a backplane for reducing display pixel voltage shifts. It will be apparent to those skilled in the art that numerous changes and modifications can be made to the specific embodiments of the invention described above without departing from the scope of the invention. Accordingly, the whole of the foregoing description is to be interpreted in an illustrative and not in a limitative sense.

The invention claimed is:

1. A backplane for an electro-optic display comprising:
a data line;
a transistor;
a pixel electrode connected to the data line via the transistor, the pixel electrode positioned adjacent to part of the data line so as to create a data line/pixel electrode capacitance; and
a shield electrode disposed adjacent to at least part of the data line so as to reduce the data line/pixel electrode capacitance.

2. A backplane according to claim 1, wherein the shield electrode extends substantially parallel to the data line.

3. A backplane according to claim 1, wherein the shield electrode has substantially the same shape as the data line.

4. A backplane according to claim 1, wherein the shield electrode is wider than the data line.

5. A backplane according to claim 1, wherein the data line and the shield electrode are positioned on a same device layer.

6. A backplane according to claim 1, wherein the data line and the shield electrode are positioned on different device layers.

7. A backplane according to claim 1, wherein part of the shield electrode extends underneath the pixel electrode.

8. An electro-optic display comprising a backplane according to claim 1, further comprising an electro-optic medium that is a rotating bichrome member or electrochromic medium.

9. An electro-optic display according to claim 8, wherein the electro-optic medium is an electrophoretic medium comprising a plurality of charged particles in a fluid and capable of moving through the fluid on application of an electric field to the electro-optic medium.

* * * * *